(12) United States Patent
Goto (10) Patent No.: US 9,172,009 B2
(45) Date of Patent: Oct. 27, 2015

(54) LIGHT-EMITTING DEVICE HAVING AN INTERLAYER OF A POLYSILOXANE MIXTURE

(71) Applicant: Konica Minolta, Inc., Tokyo (JP)

(72) Inventor: Kenji Goto, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/348,716

(22) PCT Filed: Sep. 24, 2012

(86) PCT No.: PCT/JP2012/074337
§ 371 (c)(1),
(2) Date: Mar. 31, 2014

(87) PCT Pub. No.: WO2013/047407
PCT Pub. Date: Apr. 4, 2013

(65) Prior Publication Data
US 2014/0239335 A1 Aug. 28, 2014

(30) Foreign Application Priority Data

Sep. 30, 2011 (JP) ................................. 2011-216285

(51) Int. Cl.
*H01L 33/44* (2010.01)
*H01L 33/50* (2010.01)
*H01L 33/56* (2010.01)
*C09D 183/04* (2006.01)
*C08G 77/04* (2006.01)

(52) U.S. Cl.
CPC .............. *H01L 33/50* (2013.01); *C09D 183/04* (2013.01); *H01L 33/44* (2013.01); *H01L 33/56* (2013.01); *C08G 77/045* (2013.01); *H01L 33/501* (2013.01)

(58) Field of Classification Search
CPC ................................. H01L 33/44; H01L 33/50
See application file for complete search history.

(56) References Cited

U.S. PATENT DOCUMENTS

| 5,696,862 A | * | 12/1997 | Hauer et al. | ..................... 385/88 |
| 5,712,051 A | * | 1/1998 | Sugiura et al. | ................ 428/690 |
| 5,821,685 A | * | 10/1998 | Peterson | ....................... 313/467 |
| 5,828,074 A | * | 10/1998 | Pearlman | ...................... 250/551 |

(Continued)

FOREIGN PATENT DOCUMENTS

| EP | 1873211 | 1/2008 |
| JP | 2005-158766 A | 6/2005 |

(Continued)

OTHER PUBLICATIONS

Office Action dated May 19, 2015 issued for the corresponding Japanese Patent Application No. 2013-536249.

(Continued)

*Primary Examiner* — Ida M Soward
(74) *Attorney, Agent, or Firm* — Lucas & Mercanti, LLP (57) ABSTRACT

Formation of an interlayer is realized for a light-emitting device, the interlayer having properties of anticorrosion and adhesion to a silicone layer, thus preventing incidence of cracking during a baking process. The light-emitting device includes a light-emitting element covered with the silicone layer, and the interlayer is provided between the light-emitting element and the silicone layer. The interlayer is formed of a mixture of a tri-functional polysiloxane and a tetra-functional polysiloxane.

10 Claims, 3 Drawing Sheets

(56) References Cited

U.S. PATENT DOCUMENTS

| | | | |
|---|---|---|---|
| 5,940,550 A * | 8/1999 | Plickert et al. | 385/15 |
| 6,800,424 B2 * | 10/2004 | Xu et al. | 430/321 |
| 7,160,972 B2 * | 1/2007 | Young et al. | 528/31 |
| 7,498,085 B2 * | 3/2009 | Kashiwagi et al. | 428/447 |
| 8,173,053 B2 * | 5/2012 | Taguchi et al. | 264/1.1 |
| 2007/0090359 A1 * | 4/2007 | Schalk et al. | 257/59 |
| 2007/0293623 A1 | 12/2007 | Kashiwagi et al. | |
| 2009/0189510 A1 * | 7/2009 | Kanamori et al. | 313/498 |
| 2012/0074450 A1 * | 3/2012 | Sakurai et al. | 257/98 |

FOREIGN PATENT DOCUMENTS

| | | |
|---|---|---|
| JP | 2007-002233 A | 1/2007 |
| JP | 2007-036030 A | 2/2007 |
| JP | 2007242246 | 9/2007 |
| JP | 2007-270004 A | 10/2007 |
| JP | 2008-112959 A | 5/2008 |
| JP | 2009026821 | 2/2009 |
| JP | 2009170824 | 7/2009 |
| JP | 2009173718 | 8/2009 |
| JP | 2011021078 | 2/2011 |
| JP | 2011-126994 A | 6/2011 |
| JP | 2011-178983 A | 9/2011 |

OTHER PUBLICATIONS

English translation of Office Action dated May 19, 2015 issued for the corresponding Japanese Patent Application No. 2013-536249.
Office Action dated May 20, 2015 issued for the corresponding Korean Patent Application No. 10-2014-7011136.
English translation of Office Action dated May 20, 2015 issued for the corresponding Korean Patent Application No. 10-2014-7011136.
Extended European Search Report for the corresponding European Patent Application No. 12836596.2.

* cited by examiner

| | TRANSPARENT RESIN MATERIAL | | FINE INORGANIC PARTICLES | ANTICORROSION LIGHT EMISSION EFFICIENCY (%) | ADHESION | | CRACK | |
|---|---|---|---|---|---|---|---|---|
| | TRI-FUNCTIONAL POLYSILOXANE (%) | TETRA-FUNCTIONAL POLYSILOXANE (%) | | | (RANK) | | (RANK) | |
| EMBODIMENT 1-1 | 10 | 90 | — | 94 | 4 | ○ | 3 | ○ |
| EMBODIMENT 1-2 | 20 | 80 | — | 93 | 4 | ○ | 4 | ○ |
| EMBODIMENT 1-3 | 30 | 70 | — | 95 | 4 | ○ | 4 | ○ |
| EMBODIMENT 1-4 | 35 | 65 | — | 96 | 4 | ○ | 5 | ◎ |
| EMBODIMENT 1-5 | 40 | 60 | — | 97 | 4 | ○ | 5 | ◎ |
| EMBODIMENT 1-6 | 45 | 55 | — | 96 | 4 | ○ | 5 | ◎ |
| EMBODIMENT 1-7 | 70 | 30 | — | 94 | 4 | ○ | 5 | ◎ |
| EMBODIMENT 1-8 | 80 | 20 | — | 90 | 4 | ○ | 5 | ◎ |
| EMBODIMENT 1-9 | 90 | 10 | — | 90 | 4 | ○ | 5 | ◎ |
| EMBODIMENT 2-1 | 20 | 80 | $ZrO_2$ | 95 | 5 | ◎ | 5 | ◎ |
| EMBODIMENT 2-2 | 30 | 70 | $TiO_2$ | 96 | 5 | ◎ | 5 | ◎ |
| EMBODIMENT 2-3 | 40 | 60 | $ZrO_2$ | 97 | 5 | ◎ | 5 | ◎ |
| EMBODIMENT 2-4 | 80 | 20 | $SiO_2$ | 96 | 5 | ◎ | 5 | ◎ |
| EMBODIMENT 2-5 | 60 | 40 | $ZnO$ | 95 | 5 | ◎ | 5 | ◎ |
| EMBODIMENT 2-6 | 40 | 30 | $Al_2O_3$ | 96 | 5 | ◎ | 5 | ◎ |
| CONTRASTIVE EXAMPLE 1 | — | — | | 50 | — | × | 5 | ◎ |
| CONTRASTIVE EXAMPLE 2 | 0 | 100 | | 95 | 5 | ◎ | 1 | × |
| CONTRASTIVE EXAMPLE 3 | 100 | 0 | | 75 | 2 | × | 5 | ◎ |

FIG. 3

|  | INTERMEDIATE LAYER | SILICONE CONTAINING PHOSPHOR | UNEVENNESS IN CHROMATICITY |
|---|---|---|---|
| EMBODIMENT 4 | NO | SILICON LAYER | 7% |
| CONTRASTIVE EXAMPLE 3-1 | EXIST | INTERMEDIATE LAYER | 2% |

LIGHT-EMITTING DEVICE HAVING AN INTERLAYER OF A POLYSILOXANE MIXTURE

CROSS REFERENCE TO RELATED APPLICATION

This Application is a 371 of PCT/JP2012/074337 filed on Sep. 24, 2012 which, in turn, claimed the priority of Japanese Patent Application No. JP2011-216285 filed on Sep. 30, 2011 both applications are incorporated herein by reference.

TECHNICAL FIELD

Embodiments according to the present invention relate to techniques for sealing light-emitting elements in a light-emitting device.

BACKGROUND ART

In recent years, a technique for achieving a white light-emitting device has been widely used, in which a fluorescent material like YAG (yttrium aluminum garnet) phosphor is placed in the vicinity of a blue LED (Light-Emitting Diode) chip based on gallium nitride (GaN). In such a white light-emitting device, white light is created as a color mixed of the blue light emitted by the blue LED chip with the yellow light emitted in secondary emission by the phosphor, which has received the blue light. In addition, another type of technique for generating white light as a mixed color is also employed in which the blue light emitted by the blue LED chip is mixed with the red light and the green light that are emitted as secondary emission by phosphors of the respective colors, in receipt of the blue light.

Such a white light-emitting device has various applications. For example, there is a demand that the device be used as replacements for fluorescent lights and incandescent lamps. Such application is now further extending to lighting devices like headlights for automobiles, which require very high brightness.

PRIOR ART REFERENCES

Patent References

[Patent Reference 1] Japanese Laid-Open Patent Publication No. 2008-112959

SUMMARY OF THE INVENTION

Problems to be Solved by the Invention

In such a light-emitting device, silicone may be used for fixing the phosphor on the light-emitting element. In the case where the light-emitting element is sealed only with silicone, however, corrosive gases can permeate the silicone layer to corrode reflection boards and electrodes which are sealed with the silicone layer, degrading the light reflectance and thus causing a reduction in luminous efficiency. For preventing such adverse effect from corrosive gases, a technique is disclosed for forming an interlayer that includes siloxane between the light-emitting element and the silicone layer.

If this interlayer is formed only of a tri-functional polysiloxane, however, its adhesion with the silicone layer is so bad that there is a possibility of membranous peeling occurring at the time of reflow. On the other hand, if the interlayer is formed only of a tetra-functional polysiloxane, then there is a problem that cracks may appear at the time of baking, rendering the product not worthy of use.

The object of the present invention, therefore, is to enable the formation of an interlayer that has properties of anticorrosion and adhesion with the silicone layer and that can prevent cracking at the time of baking.

Means for Solving the Problems

The invention according to item 1 is a light-emitting device in which a light-emitting element is covered with a silicone layer. The light-emitting device is characterized in that an interlayer is provided between the light-emitting element and the silicone layer, and that the interlayer is formed of a mixture of a tri-functional polysiloxane and a tetra-functional polysiloxane.

In addition, the invention according to item 2 is a light-emitting device according to item 1 which is characterized in that the content of the tri-functional polysiloxane in the mixture is from 10% by weight to 90% by weight.

In addition, the invention according to item 3 is a light-emitting device according to item 2 which is characterized in that the content of the tri-functional polysiloxane in the mixture is from 35% by weight to 70% by weight.

In addition, the invention according to item 4 is a light-emitting device according to any one of items 1 through 3 and according to item 1 which is characterized in that the interlayer includes fine inorganic particles.

In addition, the invention according to item 5 is a light-emitting device according to item 4 which is characterized in that the fine inorganic particles are of $ZrO_2$, $SiO_2$, $ZnO$, $Al_2O_3$ or $TiO_2$.

In addition, the invention according to item 6 is a light-emitting device according to any one of items 1 through 5 which is characterized in that the interlayer includes a phosphor.

In addition, the invention according to item 7 is an application liquid for forming an interlayer between a light-emitting element and a silicone layer in a light-emitting device, in which the light-emitting element is covered with the silicone layer. The application liquid is characterized in that it contains a mixture of a tri-functional polysiloxane and a tetra-functional polysiloxane.

In addition, the invention according to item 8 is an application liquid according to item 7 which is characterized in that the content of the tri-functional polysiloxane in the mixture is from 10% by weight to 90% by weight.

In addition, the invention according to item 9 is an application liquid according to item 8 which is characterized in that the content of the tri-functional polysiloxane in the mixture is from 35% by weight to 70% by weight.

In addition, the invention according to item 10 is an application liquid according to any one of items 7 through 9 which is characterized in that the liquid includes fine inorganic particles.

In addition, the invention according to item 11 is an application liquid according to item 10 which is characterized in that the fine inorganic particles are of $ZrO_2$, $SiO_2$, $ZnO$, $Al_2O_3$ or $TiO_2$.

In addition, the invention according to item 12 is an application liquid according to any one of items 7 through 11 which is characterized in that the liquid contains a phosphor.

Effects of the Invention

The present invention enables formation of an interlayer between a light-emitting element and a silicone layer in a light-emitting device, in which the light-emitting element is covered with the silicone layer, the interlayer having properties of anticorrosion and adhesion with the silicone layer and capable of preventing cracking, which may otherwise occur at the time of baking.

PREFERRED EMBODIMENTS OF THE INVENTION

Figure 1:
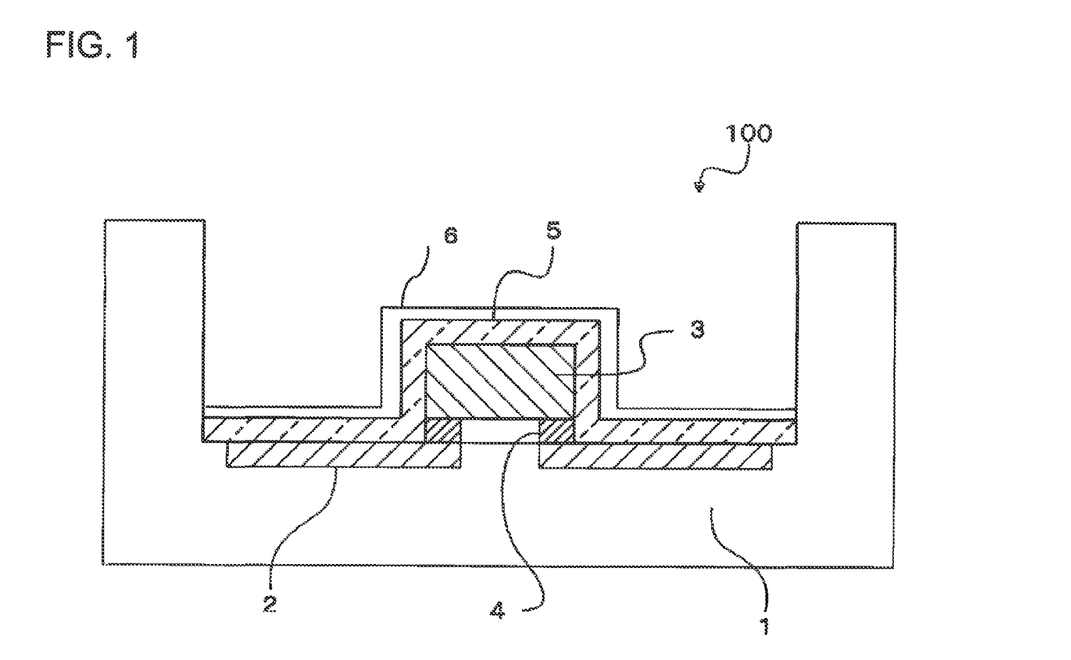
FIG. 1 is a schematic, sectional view illustrating the configuration of a light-emitting device.

At first, the configuration of a light-emitting device 100 is described in reference to FIG. 1. The light-emitting device 100 comprises an LED substrate 1, which is concave in sectional view. The recessed part (bottom) of the LED substrate 1 is provided with metallic parts 2, and disposed on the metallic parts 2 is an LED element 3, which is shaped in a rectangular parallelepiped. This LED element 3 is an example of a light-emitting element that emits light of a predetermined wavelength. There are protruding electrodes 4 so provided on the surface of the LED element 3 facing the metallic parts 2 that the metallic parts 2 and the LED element 3 are connected through the protruding electrodes 4 (flip-chip type). Incidentally, here, the configuration is illustrated with one LED element 3 for one LED substrate 1. The configuration may, however, include a plurality of LED elements 3, and they may be provided in the recess of one LED substrate 1.

This embodiment of light-emitting device 100 comprises a blue LED element as the LED element 3. The blue LED element is, for example, a stack of an n-GaN-based clad layer, an InGaN luminous layer, a p-GaN-based clad layer, and transparent electrodes on a sapphire substrate.

In the recess of the LED substrate 1, there is an interlayer 5 that has been formed to surround and seal the LED element 3. The interlayer 5 is a light-transmitting thin film, which is formed as a ceramic layer having light-transmitting property (hereinafter referred to as "transparent ceramic layer"). The thickness of the interlayer 5 is preferably from 0.1 μm to 20 μm. More preferably, it is from 0.5 μm to 10 μm, and most preferably, it is from 1 μm to 5 μm. Here, the configuration of the interlayer 5 may be such that it is provided only on the upper surface and lateral surfaces of the LED element 3. As a method of providing the interlayer 5 only around the LED element 3, for example, a masking is arranged for forming the interlayer 5. The interlayer 5 is covered and sealed with silicone resin 6 (i.e., shield with a silicone layer).

Now, the composition of the interlayer 5 is described in detail. The interlayer 5 is a transparent ceramic layer (vitreous body), which is formed by a so-called sol-gel method from a liquid mixture in sol of a transparent plastic material and an organic solvent (hereinafter referred to as "ceramic precursor fluid") to its gel state by heating, and further by baking. The interlayer 5 may also incorporate fine inorganic particles in the transparent ceramic layer. In addition to these, the transparent ceramic layer may contain a phosphor and a silicate mineral in layered formation (clay mineral in layered formation).

(Transparent Resin Material)

In the present invention, a mixture of a tri-functional polysiloxane and a tetra-functional polysiloxane is used as the transparent resin material. The tri-functional polysiloxane is a silsesquioxane, which is represented with a compositional formula of $(R-SiO_{3/2})n$. Also, the tetra-functional polysiloxane is represented with a compositional formula of $(SiO_{4/2})n$. Here, the "R" represents organo-functional groups. As the organo-functional groups "R", groups that include such hydrocarbon groups as methyl group, ethyl group, and phenyl group are used. Incidentally, the transparent resin material corresponds to the "mixture".

Silsesquioxanes can take various types of spacial configurations, for example, in shapes of basket and ladder, and also at random. As the transparent resin material of this embodiment, a silsesquioxane of basket-type structure is used because of its solidity. The basket-type silsesquioxane can be classified further by the number (even number) of silicon atoms that make up the frame of the basket-like shape. For example, the cubic basket-type silsesquioxane whose frame is built with eight silicon atoms, n=8, is expressed as T8 structure. Furthermore, the T6, T10, T12, and T14 basket-type silsesquioxanes have frames of, respectively, triangular prism, pentagonal prism, hexagonal prism, and heptagonal prism, which are respectively formed of silicon atoms.

(Phosphor)

The phosphor is an element that is excited by the light emitted by the LED element 3 and emits a fluorescent light having a wavelength different from that of the original emission. This embodiment comprises a YAG (yttrium aluminum garnet) phosphor, which is excited by the blue light (wavelength of 420 nm-485 nm) emitted by a blue LED element and emits a yellow light (wavelength of 550 nm-650 nm).

To produce such a YAG phosphor, at first, oxides of Y, Gd, Ce, Sm, Al, La, and Ga, or their compounds that will easily become oxides at high temperature are employed. These elements are mixed well at their stoichiometrical ratio to achieve a mixed raw material. Instead of doing so, a solution of rare earth elements of Y, Gd, Ce, and Sm that have been dissolved in acid at their stoichiometrical ratio may be treated with oxalic acid to effect coprecipitation, and the coprecipitates are burnt to obtain oxides. Then, the coprecipitate oxides are mixed with aluminum oxide and gallium oxide to achieve a mixed raw material. The mixed raw material is further mixed with an appropriate amount of a fluoride, for example, ammonium fluoride, as a flux, and it is then pressed to obtain a compact. The compact is put into a crucible and sintered in the air in a temperature range of 1350 to 1450 degrees Celsius for 2-5 hours to obtain a sintered compact that has luminescent property as phosphor.

Incidentally, although this embodiment comprises a YAG phosphor, the type of the phosphor used is not limited to this. For example, a non-garnet phosphor that does not include Ce or another phosphor of silicate can be used.

(Fine Inorganic Particles)

Fine inorganic particles have both the effects of improving the adhesion between the transparent resin material and the silicone sealant and of improving the strength as membrane of the transparent ceramic layer after the heating. The fine inorganic particles used in the present invention may comprise particles of oxide such as silicon oxide ($SiO_2$), titanium oxide ($TiO_2$), zirconium oxide ($ZrO_2$), zinc oxide ($ZnO$), and aluminum oxide ($Al_2O_3$) or of fluoride such as magnesium fluoride. It is particularly preferable to apply particles of silicon oxide with the intention of providing stability to the transparent ceramic layer to be formed.

Here, if the content of fine inorganic particles in the transparent ceramic layer is less than 5% by weight, then, each of the above-mentioned effects will not be realized sufficiently. On the other hand, if the content of fine inorganic particles exceeds 70% by weight, then the strength decreases of the transparent ceramic layer, which is created by heating. It is, therefore, preferable that the content of fine inorganic particles in the transparent ceramic layer is higher than 5% by weight but lower than 70% by weight, and more preferably, higher than 5% by weight but lower than 60% by weight. In addition, it is preferable that the mean particle diameter of fine inorganic particles to be applied be larger than 0.001 µm but smaller than 50 µm for achieving each of the above-mentioned effects. The mean particle diameter of the fine inorganic particles can be measured, for example, by Coulter counter method.

(Application Liquid)

As explained above, the interlayer 5 having light-transmitting property is formed by applying, to the place where the interlayer 5 is to be formed, an application liquid prepared as a mixture of fine inorganic particles in a ceramic precursor fluid, which itself is a transparent resin material mixed (or diluted) with an organic solvent, and then by heating the application liquid.

As the organic solvent, it is preferable to use a solvent that is superior in solubility with added water and has a boiling point of lower than 100 degrees Celsius. Such a solvent may be, for example, aliphatic hydrocarbons, aromatic hydrocarbons, halogen hydrocarbons, ethers, esters, alcohols, and ketones. It is preferable to use methyl ethyl ketone, tetrahydrofuran, benzene, chloroform, ethyl ether, isopropyl ether, dibutyl ether, ethyl butyl ether, methanol, ethanol, isopropyl alcohol, or acetone.

The application liquid made in the above-mentioned composition is applied for formation of a thin film of transparent ceramic layer, which comes to be the interlayer 5. There is no particular restriction to how the transparent ceramic layer is formed. However, it can be done advantageously, for example, with a spraying device, which is used for spraying the application liquid on the light-emitting device 100. Then, the application liquid applied on the device is heated to form an interlayer 5 that has a predetermined film thickness.

Incidentally, the above-mentioned embodiment involves a spraying device for the application of the application liquid. Various types of coating machines, however, may be utilized for the application. In addition, the specific shape, placement, and numerical values that are presented for the light-emitting device in the above-mentioned preferred embodiment are modifiable appropriately within the scope that does not deviate from the spirit of the present invention.

Additionally, the interlayer 5 is covered and sealed with silicone resin 6 (i.e., shield with a silicone layer). In this way, the deterioration of the interlayer 5 that may otherwise be caused by aging can be restrained, improving even further the adhesion of the interlayer 5 to the LED substrate 1 and to the LED element 3.

Figure 2:
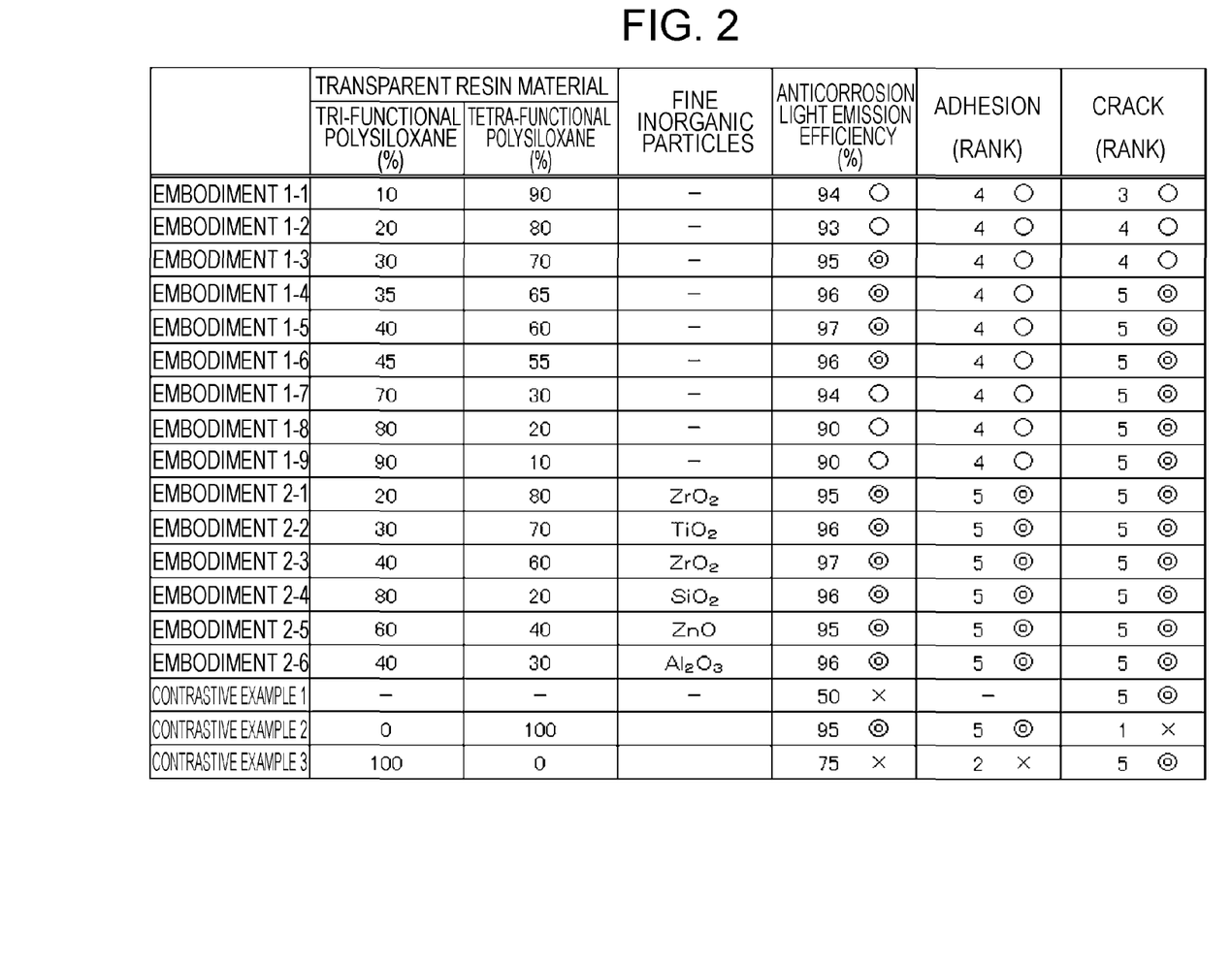
FIG. 2 is a table showing evaluation results of embodiments 1-1 through 1-9 and embodiments 2-1 through 2-6.

Now, specific compositions of the application liquid, which is used for forming the interlayer 5, are explained as embodiments below. Specifically, samples are prepared with changes in composition of the application liquid as contrastive examples 1-3, embodiments 1-1 through 1-9, and embodiments 2-1 through 2-6. Then, each sample is evaluated on "anticorrosion property," "adhesion property," and "cracking". Embodiments 1-1 through 1-9 are samples of mixture of a tri-functional polysiloxane and a tetra-functional polysiloxane whose ratios are varied respectively. Embodiments 2-1 through 2-6 are samples of mixture of the tri-functional polysiloxane and the tetra-functional polysiloxane which are added with fine inorganic particles in addition to the variations in ratio. In addition, contrastive examples 1-3 are prepared as objects against which each of the examples is compared for evaluation. Contrastive example 1 is a sample on which only silicone-sealing is provided, i.e., without provision of the application liquid (i.e., no interlayer 5 is formed). Contrastive examples 2 and 3 are samples each of which contains only one of the tri-functional polysiloxane and the tetra-functional polysiloxane. In the following, at first, explanation is given of the methods of conducting the "anticorrosion evaluation", "adhesion evaluation", and "crack evaluation", and then, evaluation results are summarized with specific conditions that have been applied to each of the contrastive examples and each of the embodiments. Incidentally, the evaluation results are shown in FIG. 2, which is a table that shows evaluation results on embodiments 1-1 through 1-9 and embodiments 2-1 through 2-6.

(Anticorrosion Evaluation)

In the anticorrosion evaluation, a light-emitting device 100 is created for every embodiment, and it is exposed into an environment of hydrogen sulfide at 10-15 ppm, at a temperature of 25 degrees Celsius, and at a humidity of 75% RH for 504 hours. Before and after the exposure is made, the value of total luminous flux is measured, and the ratio of the total luminous flux values before and after the exposure is used as an indicator of evaluation. In the measurement, the total luminous flux is determined with Spectral Emission Luminance Meter CS-2000 (product of Konica Minolta Sensing Inc.). In this evaluation, if the ratio of the total luminous flux value after the exposure to that before is equal to or higher than 95%, then it is marked with "⊚ (double circle)". If it is equal to or higher than 90% but lower than 95%, then it is marked with "○ (circle)". If it is lower than 90%, then it is marked with "x". Incidentally, the ratios higher than 90% are considered within the range that does not cause any problem in practical application.

(Adhesion Evaluation)

In the adhesion evaluation, for each of the embodiments, a glass plate applied with the application liquid by spin-coating is heated at 150 degrees Celsius for one hour. The glass plate is further applied with a silicone resin with an applicator and heated again at 150 degrees Celsius for one hour. The glass plates so prepared are used as samples. By using a heat-contrast shock tester, these samples are made to undergo 100 cycles of heat stress, one cycle taking an hour and comprising a 30 minute stay at 100 degrees Celsius and a 30 minute stay at −40 degrees Celsius. After that, the surface of each sample is notched into 100 block sections in checkerboard pattern, and a peeling test is conducted on each sample by using Nichiban-made tape. The block sections that have been peeled off are counted for evaluation on a five rank scale. Rank 5 indicates that there is no peeling-off of the block sections. Rank 4 indicates that 1-5 block sections have peeled off. Rank 3 indicates that 6-10 block sections have peeled off. Rank 2 indicates that more than 11 block sections have peeled off. Rank 1 indicates that all the block sections have peeled off. In this evaluation, the evaluated ranks are marked, respectively, with "⊚ (double circle)" for rank 4, with "○" for ranks 4 and 3, and with "x" for rank 2 and the lower. Incidentally, rank 3 and above are levels of quality to suffer no problem in practical application.

(Crack Evaluation)

In the crack evaluation, for each of the embodiments, 100 samples of the application liquid are applied on a glass plate, which is then heated at 150 degrees Celsius for one hour. The samples are then evaluated on incidence of cracking. In this evaluation, rank 5 indicates that the occurrence of cracking is 0%; rank 4 indicates 0% to lower than 5% cracking: rank 3 is 5% to lower than 10%; rank 2 is 10% to lower than 20%; and rank 1 is 20% or higher. After that, the evaluated ranks are marked, respectively, with "⊚ (double circle)" for rank 5, with "○" for ranks 4 and 3, and with "x" for rank 2 and the lower. Incidentally, rank 3 and above are levels of quality to suffer no problem in practical application.

The following are summaries of specific conditions applied on contrastive examples 1-3, embodiments 1-1 through 1-9, and embodiments 2-1 through 2-4 and their respective evaluation results.

Contrastive Example 1

Contrastive example 1 represents a sample that is only silicone-sealed, i.e., without an application liquid according to the present invention. Specifically, the sample does not have any interlayer 5 on the LED element 3, but it has been sealed with a silicone that contains a phosphor and been heated at a temperature of 150 degrees Celsius for one hour before being evaluated. As shown in FIG. 2, the evaluation of contrastive example 1 on anticorrosion property has resulted in 50% (x) while the evaluation on cracking has resulted in rank 5 (⊚ (double circle)). Incidentally, no adhesion evaluation is performed on contrastive example 1 since it has no interlayer 5.

Contrastive Example 2

Contrastive example 2 is a case where a tetra-functional polysiloxane is employed instead of an application liquid according to the present invention. Specifically, a tetra-functional polysiloxane is applied on an LED element 3 by using a spraying applicator in such a way that the applied polysiloxane will dry up and result in a 1 μm thick film. This whole object is then heated at 150 degrees Celsius for one hour. After the heating, the object is sealed with a silicone containing a phosphor, and it is heated again at 150 degrees Celsius for one hour before being subjected to evaluation. As shown in FIG. 2, the evaluation of contrastive example 2 on anticorrosion property has resulted in 95% (⊚ (double circle)), and the evaluation on adhesion has resulted in rank 5 (⊚ (double circle)). This shows that there is an improvement in anticorrosion property in comparison with contrastive example 1. However, the evaluation on cracking has resulted in rank 1 (x), so the sample is prone to cracking.

Contrastive Example 3

Contrastive example 3 is a case where a tri-functional polysiloxane is employed instead of an application liquid according to the present invention. Specifically, a tri-functional polysiloxane is applied on an LED element 3 by using a spraying applicator in such a way that the applied polysiloxane will dry up and result in a 1 μm thick film. This object is then heated at 150 degrees Celsius for one hour. After the heating, the object is sealed with a silicone containing a phosphor, and it is heated again at 150 degrees Celsius for one hour before being subjected to evaluation. As shown in FIG. 2, the evaluation of contrastive example 3 on anticorrosion property has resulted in 75% (x), and the evaluation on adhesion has resulted in rank 2 (x). This shows that contrastive example 3 has lower anticorrosion and adhesion properties than contrastive example 2. On the other hand, the evaluation on cracking has resulted in rank 5 (⊚ (double circle)), indicating that contrastive example 3 is less prone to cracking than contrastive example 2.

Embodiment 1-1

Now, the description concerns embodiment 1-1. In this embodiment, a liquid mixture of a tri-functional polysiloxane and a tetra-functional polysiloxane is prepared at the ratio of the tri-functional polysiloxane being at 10% by weight and the tetra-functional polysiloxane at 90% by weight. This mixture is used to produce an application liquid according to the present invention. This application liquid is applied on an LED element 3 by using a spraying applicator in such a way that the application liquid will dry up and result in a 1 μm thick film. This object is then heated at 150 degrees Celsius for one hour. After the heating, the object is sealed with a silicone containing a phosphor, and it is heated again at 150 degrees Celsius for one hour before being subjected to evaluation. As shown in FIG. 2, the evaluation of this embodiment on anticorrosion property has resulted in 94% (○). The evaluation on adhesion has resulted in rank 4 (○), and the evaluation on cracking has resulted in rank 3 (○).

Embodiment 1-2

Now, the description concerns embodiment 1-2. In this embodiment, a liquid mixture of a tri-functional polysiloxane and a tetra-functional polysiloxane is prepared at the ratio of the tri-functional polysiloxane being at 20% by weight and the tetra-functional polysiloxane at 80% by weight. This mixture is used to produce an application liquid according to the present invention. Incidentally, evaluation samples are produced by the same method as used for embodiment 1-1. As shown in FIG. 2, the evaluation of this embodiment on anticorrosion property has resulted in 93% (○). The evaluation on adhesion has resulted in rank 4 (○), and the evaluation on cracking has resulted in rank 4 (○).

Embodiment 1-3

Now, the description concerns embodiment 1-3. In this embodiment, a liquid mixture of a tri-functional polysiloxane and a tetra-functional polysiloxane is prepared at the ratio of the tri-functional polysiloxane being at 30% by weight and the tetra-functional polysiloxane at 70% by weight. This mixture is used to produce an application liquid according to the present invention. Incidentally, evaluation samples are produced by the same method as used for embodiment 1-1. As shown in FIG. 2, the evaluation of this embodiment on anticorrosion property has resulted in 95% (⊚). The evaluation on adhesion has resulted in rank 4 (○), and the evaluation on cracking has resulted in rank 4 (○).

Embodiment 1-4

Now, the description concerns embodiment 1-4. In this embodiment, a liquid mixture of a tri-functional polysiloxane and a tetra-functional polysiloxane is prepared at the ratio of the tri-functional polysiloxane being at 35% by weight and the tetra-functional polysiloxane at 65% by weight. This mixture is used to produce an application liquid according to the present invention. Incidentally, evaluation samples are produced by the same method as used for embodiment 1-1. As shown in FIG. 2, the evaluation of this embodiment on anticorrosion property has resulted in 96% (⊚ (double circle)). The evaluation on adhesion has resulted in rank 4 (○), and the evaluation on cracking has resulted in rank 5 (⊚ (double circle)).

Embodiment 1-5

Now, the description concerns embodiment 1-5. In this embodiment, a liquid mixture of a tri-functional polysiloxane and a tetra-functional polysiloxane is prepared at the ratio of the tri-functional polysiloxane being at 40% by weight and the tetra-functional polysiloxane at 60% by weight. This mixture is used to produce an application liquid according to the present invention. Incidentally, evaluation samples are produced by the same method as used for embodiment 1-1. As shown in FIG. 2, the evaluation of this embodiment on anticorrosion property has resulted in 97% (⊚ (double circle)). The evaluation on adhesion has resulted in rank 4 (○), and the evaluation on cracking has resulted in rank 5 (⊚ (double circle)).

Embodiment 1-6

Now, the description concerns embodiment 1-6. In this embodiment, a liquid mixture of a tri-functional polysiloxane and a tetra-functional polysiloxane is prepared at the ratio of the tri-functional polysiloxane being at 45% by weight and the tetra-functional polysiloxane at 55% by weight. This mixture is used to produce an application liquid according to the present invention. Incidentally, evaluation samples are produced by the same method as used for embodiment 1-1. As shown in FIG. 2, the evaluation of this embodiment on anticorrosion property has resulted in 96% (⊚ (double circle)). The evaluation on adhesion has resulted in rank 4 (○), and the evaluation on cracking has resulted in rank 5 (⊚ (double circle)).

Embodiment 1-7

Now, the description concerns embodiment 1-7. In this embodiment, a liquid mixture of a tri-functional polysiloxane and a tetra-functional polysiloxane is prepared at the ratio of the tri-functional polysiloxane being at 70% by weight and the tetra-functional polysiloxane at 30% by weight. This mixture is used to produce an application liquid according to the present invention. Incidentally, evaluation samples are produced by the same method as used for embodiment 1-1. As shown in FIG. 2, the evaluation of this embodiment on anticorrosion property has resulted in 94% (○). The evaluation on adhesion has resulted in rank 4 (○), and the evaluation on cracking has resulted in rank 5 (⊚ (double circle)).

Embodiment 1-8

Now, the description concerns embodiment 1-8. In this embodiment, a liquid mixture of a tri-functional polysiloxane and a tetra-functional polysiloxane is prepared at the ratio of the tri-functional polysiloxane being at 80% by weight and the tetra-functional polysiloxane at 20% by weight. This mixture is used to produce an application liquid according to the present invention. Incidentally, evaluation samples are produced by the same method as used for embodiment 1-1. As shown in FIG. 2, the evaluation of this embodiment on anticorrosion property has resulted in 90% (○). The evaluation on adhesion has resulted in rank 4 (○), and the evaluation on cracking has resulted in rank 5 (⊚ (double circle)).

Embodiment 1-9

Now, the description concerns embodiment 1-9. In this embodiment, a liquid mixture of a tri-functional polysiloxane and a tetra-functional polysiloxane is prepared at the ratio of the tri-functional polysiloxane being at 90% by weight and the tetra-functional polysiloxane at 10% by weight. This mixture is used to produce an application liquid according to the present invention. Incidentally, evaluation samples are produced by the same method as used for embodiment 1-1. As shown in FIG. 2, the evaluation of this embodiment on anticorrosion property has resulted in 90% (○). The evaluation on adhesion has resulted in rank 4 (○), and the evaluation on cracking has resulted in rank 5 (⊚ (double circle)).

As indicated by the above evaluation results of embodiments 1-1 through 1-9, in the liquid mixture of a tri-functional polysiloxane and a tetra-functional polysiloxane, the content of the tri-functional polysiloxane being between 10% by weight and 90% by weight improves the anticorrosion and adhesion properties in comparison with the case where only the tri-functional polysiloxane is applied. In addition, in the liquid mixture of a tri-functional polysiloxane and a tetra-functional polysiloxane, the content of the tri-functional polysiloxane being between 35% by weight and 45% by weight restrains and lowers the incidence of cracking during baking, in addition to the improvement made in the anticorrosion and adhesion properties.

Embodiment 2-1

Now, the description concerns embodiment 2-1. In this embodiment, a liquid mixture of a tri-functional polysiloxane and a tetra-functional polysiloxane is prepared at the ratio of the tri-functional polysiloxane being at 20% by weight and the tetra-functional polysiloxane at 80% by weight. This mixture is used to produce an application liquid according to the present invention.

Additionally, in this embodiment, the application liquid is added with zinc oxide (ZnO2) at 30% by weight as fine inorganic particles. Incidentally, evaluation samples are produced by the same method as used for embodiment 1-1. As shown in FIG. 2, the evaluation of this embodiment on anticorrosion property has resulted in 95% (⊚ (double circle)). The evaluation on adhesion has resulted in rank 5 (⊚ (double circle)), and the evaluation on cracking has resulted in rank 5 (⊚ (double circle)).

Embodiment 2-2

Now, the description concerns embodiment 2-2. In this embodiment, a liquid mixture of a tri-functional polysiloxane and a tetra-functional polysiloxane is prepared at the ratio of the tri-functional polysiloxane being at 30% by weight and the tetra-functional polysiloxane at 70% by weight. This mixture is used to produce an application liquid according to the present invention.

Additionally, in this embodiment, the application liquid is added with titanium oxide (TiO2) at 30% by weight as fine inorganic particles. Incidentally, evaluation samples are produced by the same method as used for embodiment 1-1. As shown in FIG. 2, the evaluation of this embodiment on anticorrosion property has resulted in 96% (⊚ (double circle)). The evaluation on adhesion has resulted in rank 5 (⊚ (double circle)), and the evaluation on cracking has resulted in rank 5 (⊚ (double circle)).

Embodiment 2-3

Now, the description concerns embodiment 2-3. In this embodiment, a liquid mixture of a tri-functional polysiloxane and a tetra-functional polysiloxane is prepared at the ratio of the tri-functional polysiloxane being at 40% by weight and the tetra-functional polysiloxane at 60% by weight. This mixture is used to produce an application liquid according to the present invention.

Additionally, in this embodiment, the application liquid is added with zirconium oxide (ZrO2) at 30% by weight as fine inorganic particles. Incidentally, evaluation samples are produced by the same method as used for embodiment 1-1. As shown in FIG. 2, the evaluation of this embodiment on anticorrosion property has resulted in 97% (⊚ (double circle)). The evaluation on adhesion has resulted in rank 5 (⊚ (double circle)), and the evaluation on cracking has resulted in rank 5 (⊚ (double circle)).

Embodiment 2-4

Now, the description concerns embodiment 2-4. In this embodiment, a liquid mixture of a tri-functional polysiloxane and a tetra-functional polysiloxane is prepared at the ratio of the tri-functional polysiloxane being at 80% by weight and the tetra-functional polysiloxane at 20% by weight. This mixture is used to produce an application liquid according to the present invention.

Additionally, in this embodiment, the application liquid is added with silicon oxide ($SiO_2$) at 30% by weight as fine inorganic particles. Incidentally, evaluation samples are produced by the same method as used for embodiment 1-1. As shown in FIG. 2, the evaluation of this embodiment on anticorrosion property has resulted in 96% (⊚ (double circle)). The evaluation on adhesion has resulted in rank 5 (⊚ (double circle)), and the evaluation on cracking has resulted in rank 5 (⊚ (double circle)).

Embodiment 2-5

Now, the description concerns embodiment 2-5. In this embodiment, a liquid mixture of a tri-functional polysiloxane and a tetra-functional polysiloxane is prepared at the ratio of the tri-functional polysiloxane being at 80% by weight and the tetra-functional polysiloxane at 20% by weight. This mixture is used to produce an application liquid according to the present invention.

Additionally, in this embodiment, the application liquid is added with zinc oxide (ZnO) at 30% by weight as fine inorganic particles. Incidentally, evaluation samples are produced by the same method as used for embodiment 1-1. As shown in FIG. 2, the evaluation of this embodiment on anticorrosion property has resulted in 95% (⊚ (double circle)). The evaluation on adhesion has resulted in rank 5 (⊚ (double circle)), and the evaluation on cracking has resulted in rank 5 (⊚ (double circle)).

Embodiment 2-6

Now, the description concerns embodiment 2-6. In this embodiment, a liquid mixture of a tri-functional polysiloxane and a tetra-functional polysiloxane is prepared at the ratio of the tri-functional polysiloxane being at 80% by weight and the tetra-functional polysiloxane at 20% by weight. This mixture is used to produce an application liquid according to the present invention.

Additionally, in this embodiment, the application liquid is added with aluminum oxide ($Al_2O_3$) at 30% by weight as fine inorganic particles. Incidentally, evaluation samples are produced by the same method as used for embodiment 1-1. As shown in FIG. 2, the evaluation of this embodiment on anticorrosion property has resulted in 96% (⊚ (double circle)). The evaluation on adhesion has resulted in rank 5 (⊚), and the evaluation on cracking has resulted in rank 5 (⊚ (double circle)).

As indicated by the evaluation results of embodiments 2-1 through 2-6, the application liquid incorporated with fine inorganic particles enhances the adhesive force between the interlayer 5 and the silicone resin by anchor effect, improving the adhesion property in comparison with the case where no fine inorganic particles are provided.

Now, the unevenness in chromaticity caused by the presence or absence of the interlayer 5 is evaluated with embodiment 3-1 according to the present invention and contrastive example 4 as a comparative object. The following are summaries of conditions applied to embodiment 3-1 and contrastive example 4 and of their evaluation results.

Embodiment 3-1

At first, a liquid mixture of 1 g of a phosphor, 4.4 g of IPA, and 2.2 g of silica ($SiO_2$) is prepared. This mixture is applied on an LED element 3 by using a spraying applicator in such a way that the applied mixture will dry up and result in a 35 μm thick film, and it is heated at 150 degrees Celsius for one hour. After that, a liquid mixture of 20 g of a tri-functional polysiloxane and 30 g of a tetra-functional polysiloxane is applied by using a spraying applicator in such a way that the applied mixture will dry up and result in an 8 μm thick film. This object is then heated at 150 degrees Celsius for one hour to form an interlayer 5 on the LED element 3. Incidentally, after the formation of the interlayer 5, the object is seal with a silicone and then heated at 150 degrees Celsius for one hour before being used as a sample for evaluation.

Incidentally, contrastive example 4 is a sample whose LED element 3 is sealed with a silicone that contains a phosphor, without formation of an interlayer 5.

Figure 3:
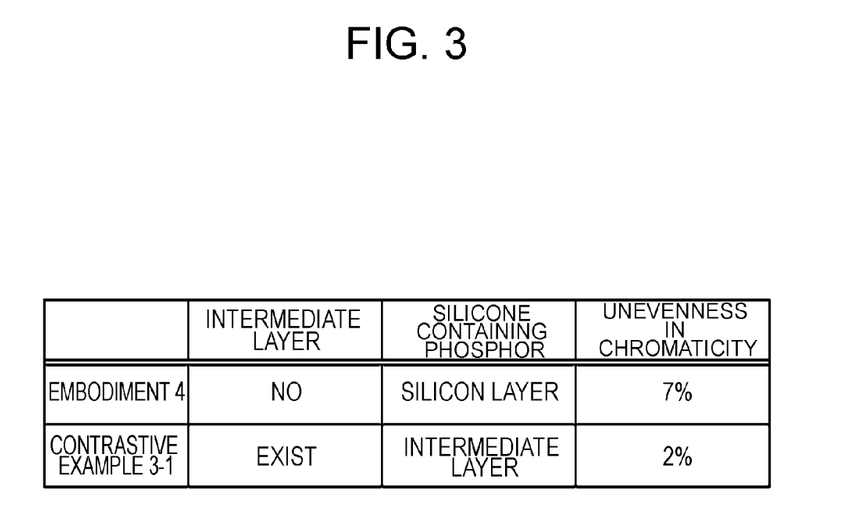
FIG. 3 is a table showing evaluation results of embodiment 3-1.

For each of embodiment 3-1 and contrastive example 4, 100 samples are prepared and evaluated on unevenness in chromaticity. Results are summarized in FIG. 3, which is a table showing evaluation results of embodiment 3-1. As shown in FIG. 3, the unevenness in chromaticity of embodiment 3-1 is 2% while the unevenness in chromaticity of contrastive example 4 is 7%. This fact indicates that the formation of an interlayer 5 with the application liquid according to this embodiment can reduce the unevenness in chromaticity in comparison with the case where no interlayer 5 is provided.

As explained above, a light-emitting device 100 according to the present invention comprises an interlayer 5 that is formed with an application liquid containing a liquid mixture of a tri-functional polysiloxane and a tetra-functional polysiloxane. This configuration improves the anticorrosion and adhesion properties of the device in comparison with the case where the interlayer 5 is formed of only one of the tri-functional polysiloxane and the tetra-functional polysiloxane, resulting in reduced incidence of cracking during baking. In addition, if the application liquid is added with fine inorganic particles, then it improves the adhesion property because of the anchoring effect of the fine inorganic particles.

DESCRIPTIONS OF NUMBERED PARTS

1, LED substrate;
2, Metallic parts;
3, LED element;
4, Protruding electrodes;
5, Interlayer; and
100, Light-emitting device.

What is claimed is:
1. A light-emitting device in which a light-emitting element is covered with a silicone layer, the light-emitting device comprising an interlayer configured to be between the light-emitting element and the silicone layer, wherein the interlayer is formed of a mixture of a tri-functional polysiloxane and a tetra-functional polysiloxane.

2. A light-emitting device according to claim 1, wherein the content of the tri-functional polysiloxane in the mixture is 10% by weight to 90% by weight.

3. A light-emitting device according to claim 2, wherein the content of the tri-functional polysiloxane in the mixture is 35% by weight to 70% by weight.

4. A light-emitting device according to claim 1, wherein the interlayer includes fine inorganic particles.

5. A light-emitting device according to claim 4, wherein the fine inorganic particles are of $ZrO_2$, $SiO_2$, ZnO, $Al_2O_3$ or $TiO_2$.

6. A light-emitting device according to claim 1, wherein the interlayer includes a phosphor.

7. A light-emitting device according to claim 2, wherein the interlayer includes fine inorganic particles.

8. A light-emitting device according to claim 3, wherein the interlayer includes fine inorganic particles.

9. A light-emitting device according to claim 2, wherein the interlayer includes a phosphor.

10. A light-emitting device according to claim 3, wherein the interlayer includes a phosphor.

* * * * *